United States Patent [19]
Takasu

[11] Patent Number: 5,308,445
[45] Date of Patent: May 3, 1994

[54] METHOD OF MANUFACTURING A SEMICONDUCTOR DEVICE HAVING A SEMICONDUCTOR GROWTH LAYER COMPLETELY INSULATED FROM A SUBSTRATE

[75] Inventor: Hidemi Takasu, Kyoto, Japan

[73] Assignee: Rohm Co., Ltd., Kyoto, Japan

[21] Appl. No.: 957,514

[22] Filed: Oct. 5, 1992

[30] Foreign Application Priority Data

Oct. 23, 1991 [JP] Japan .................................. 3-275740
Oct. 25, 1991 [JP] Japan .................................. 3-279830

[51] Int. Cl.$^5$ ............................................ H01L 21/20
[52] U.S. Cl. ........................................ 117/90; 437/83;
437/84; 437/89; 437/100; 437/915; 117/935
[58] Field of Search ............... 437/83, 84, 89, 100, 437/915; 156/612; 148/DIG. 26, DIG. 164

[56] References Cited

U.S. PATENT DOCUMENTS 4,760,036 7/1988 Schubert .............................. 437/83

FOREIGN PATENT DOCUMENTS 0174308 7/1988 Japan .................................. 437/915

OTHER PUBLICATIONS

D. D. Rathman et al., "Lateral Epitaxial Overgrowth of Silicon on SiO$_2$", Journal of Electro-Chemical Society: Solid-State Science and Technology, Oct. 1992, p. 2303.
T. Yonehara et al., "New SOI-Selective Nucleation Epitaxy", Proceedings of the 48th Conference on Applied Physics, Autumn 1987, 19p-Q-15, p. 583.

Primary Examiner—Olik Chaudhuri
Assistant Examiner—Ramamohan Rao Paladugu
Attorney, Agent, or Firm—Law Office of Steven M. Rabin

[57] ABSTRACT

A silicon oxide layer is formed on a silicon substrate, and an opening whose wall is sloped inward is formed in the silicon oxide layer. A seed crystalline silicon layer is formed from the opening. The seed crystalline layer is selectively oxidized while leaving the seed crystalline layer required for crystal growth. An oxide formed at this time closes the opening. Consequently, the seed crystalline layer is insulated from the silicon substrate. The seed crystalline layer is epitaxially grown, to obtain a silicon growth layer on a field oxide layer. The growth layer is insulated from the silicon substrate, and is uniform in surface direction. Accordingly, there is no parasitic capacitance due to a p-n junction between the silicon substrate and the growth layer, thereby to make it possible to perform a high-speed operation. In addition, the growth layer is uniform in surface direction, thereby to make it easy to control the conditions set so as to obtain desired device characteristics in the manufacturing processes.

32 Claims, 10 Drawing Sheets

METHOD OF MANUFACTURING A SEMICONDUCTOR DEVICE HAVING A SEMICONDUCTOR GROWTH LAYER COMPLETELY INSULATED FROM A SUBSTRATE

BACKGROUND OF THE INVENTION

1. Field of the Invention

The present invention relates to a method of manufacturing a semiconductor device having a structure having a semiconductor growth layer on an insulation layer.

2. Description of the Prior Art

In a semiconductor integrated circuit, an epitaxial growth layer is generally formed on a silicon substrate, and devices are formed on the epitaxial growth layer. In this structure, however, a p-n junction is formed in the interface of the silicon substrate and the epitaxial growth layer, so that parasitic capacitance arises. The parasitic capacitance causes the operating speed of the devices to be reduced. Consequently, the above-described structure is not suitable for the formation of devices requiring a high-speed operation.

In order to solve this problem, it has been desired in recent years to develop the SOI (Semiconductor-On-Insulator) technique for forming an insulation layer on a silicon substrate and further forming a single-crystalline silicon layer on the insulation layer. This technique is an attempt to prevent a p-n junction from being formed between the single-crystalline silicon layer and the silicon substrate by insulating the single-crystalline silicon layer from the silicon substrate.

Figure 11:
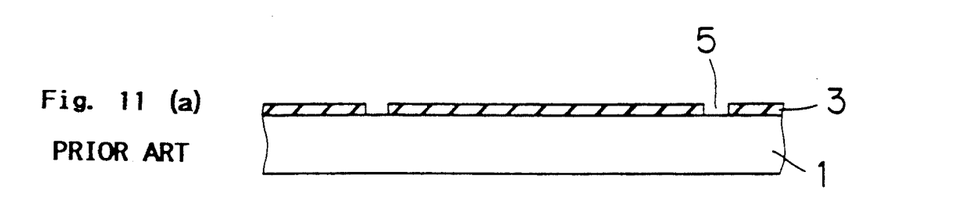
FIGS. 11(a) and 11(b) are cross sectional views showing the conventional SOI technique using the ELO process.

FIG. 11 illustrates the conventional SOI technique using the ELO (Epitaxial Lateral Overgrowth) process (see an article by D. D. Rathman et al, entitled "Lateral Epitaxial Overgrowth of Silicon on SiO$_2$", JOURNAL OF ELECTRO-CHEMICAL SOCIETY SOLID-STATE SCIENCE AND TECHNOLOGY, October 1982, p. 2303).

First, a silicon oxide film 3 is grown on the surface of a semiconductor substrate 1. The silicon oxide film 3 is then selectively etched using a photoresist, to open seed windows 5 (see FIG. 11 (a)). In addition, selective epitaxial growth of silicon is made in the longitudinal direction from each of the seed windows 5. Subsequently, epitaxial growth in the lateral direction is made, to form an epitaxial layer 7 on the silicon oxide film 3 (see FIG. 11 (b)). In such a manner, the area of a p-n junction between the epitaxial layer 7 and the silicon substrate 1 can be decreased to the size of the seed window 5. Consequently, the capacitance of the p-n junction can be decreased, thereby to make it possible to operate devices at higher speed.

In this ELO process, however, the p-n junction is not completely prevented from being formed, although the area of the p-n junction is decreased. That is, in the seed window 5, the formation of the p-n junction is unavoidable. Consequently, it is difficult to obtain an SOI structure having a large area on the silicon substrate, and the devices are prevented from being operated at still higher speed.

On the other hand, other methods for obtaining an SOI structure include a method referred to as the SENTAXY process (see an article by T. Yonehara et al, entitled "New SOI-Selective Nucleation Epitaxy, Proceedings of 48-th Conference on Applied Physics, 1987 (Autumn), 19p-Q-15, p. 583). This is a method of artificially forming a plurality of silicon nuclei for crystal growth on an insulation layer such as a silicon oxide film and making epitaxial growth from the respective nuclei. A method of forming a silicon nitride film having a very small area as a nucleus and using the same, a method of forming nuclei using the FIB (Focused Ion Beam) process, and the like have been examined.

According to this method, an epitaxial layer and a silicon substrate can be completely insulated from each other by the insulation layer such as the oxide film, thereby to make it possible to solve the above-described problem due to the capacitance of the p-n junction.

In this SENTAXY process, however, a new problem arises that parts of the epitaxial layer respectively grown from the plurality of nuclei differ from each other in surface direction. If the parts of the epitaxial layer grown from the respective silicon nuclei differ from each other in surface direction, characteristics such as an oxidation rate vary in the respective parts of the epitaxial layer. As a result, there arises a problem that the characteristics of devices formed on the respective parts of the epitaxial layer cannot be made equal.

3. Description of the Related Art

Figure 9:
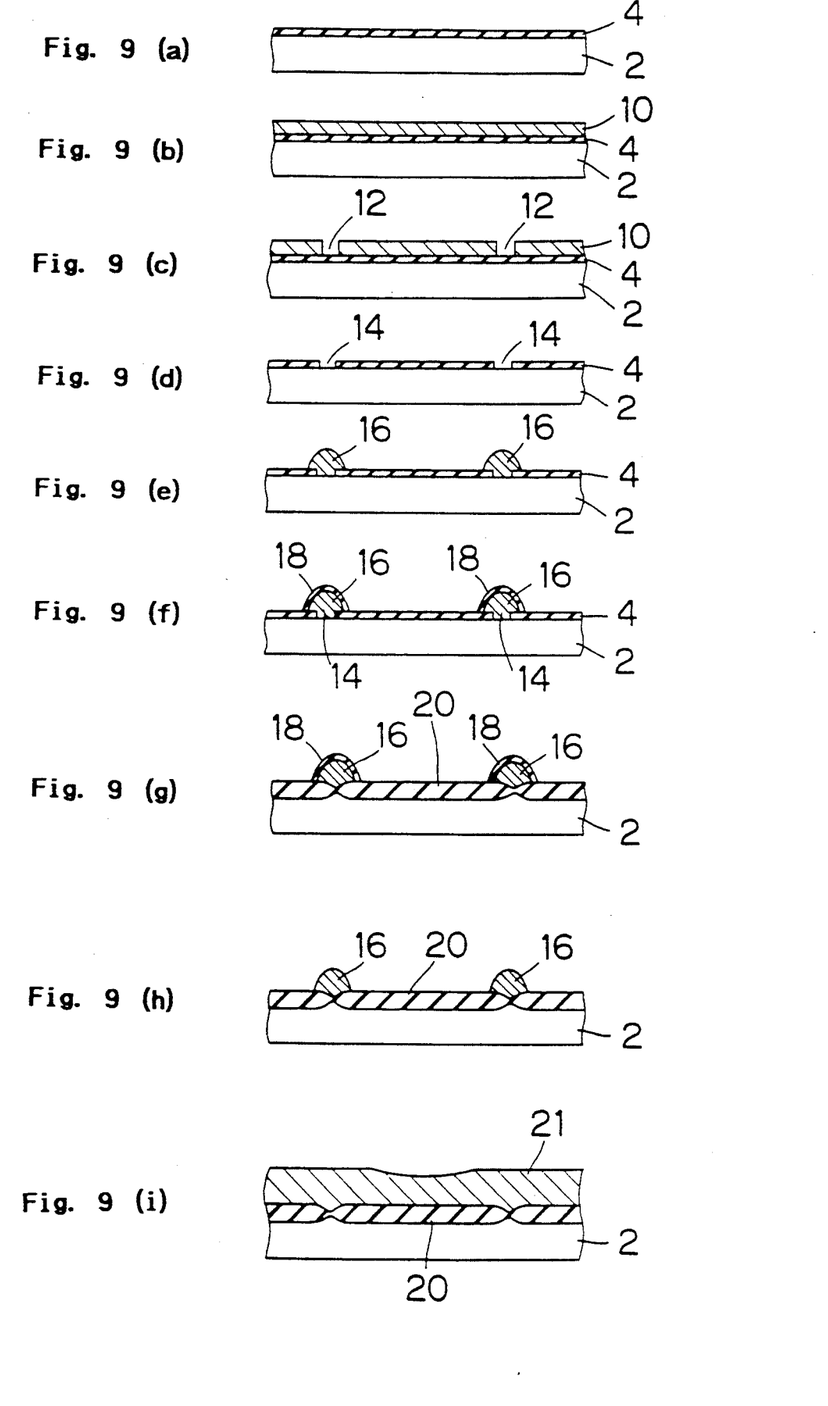
FIGS. 9(a)-9(i) are simplified cross-sectional views showing the sequential steps of a method of manufacturing a semiconductor device previously proposed by the applicant of the present application.
Figure 10:
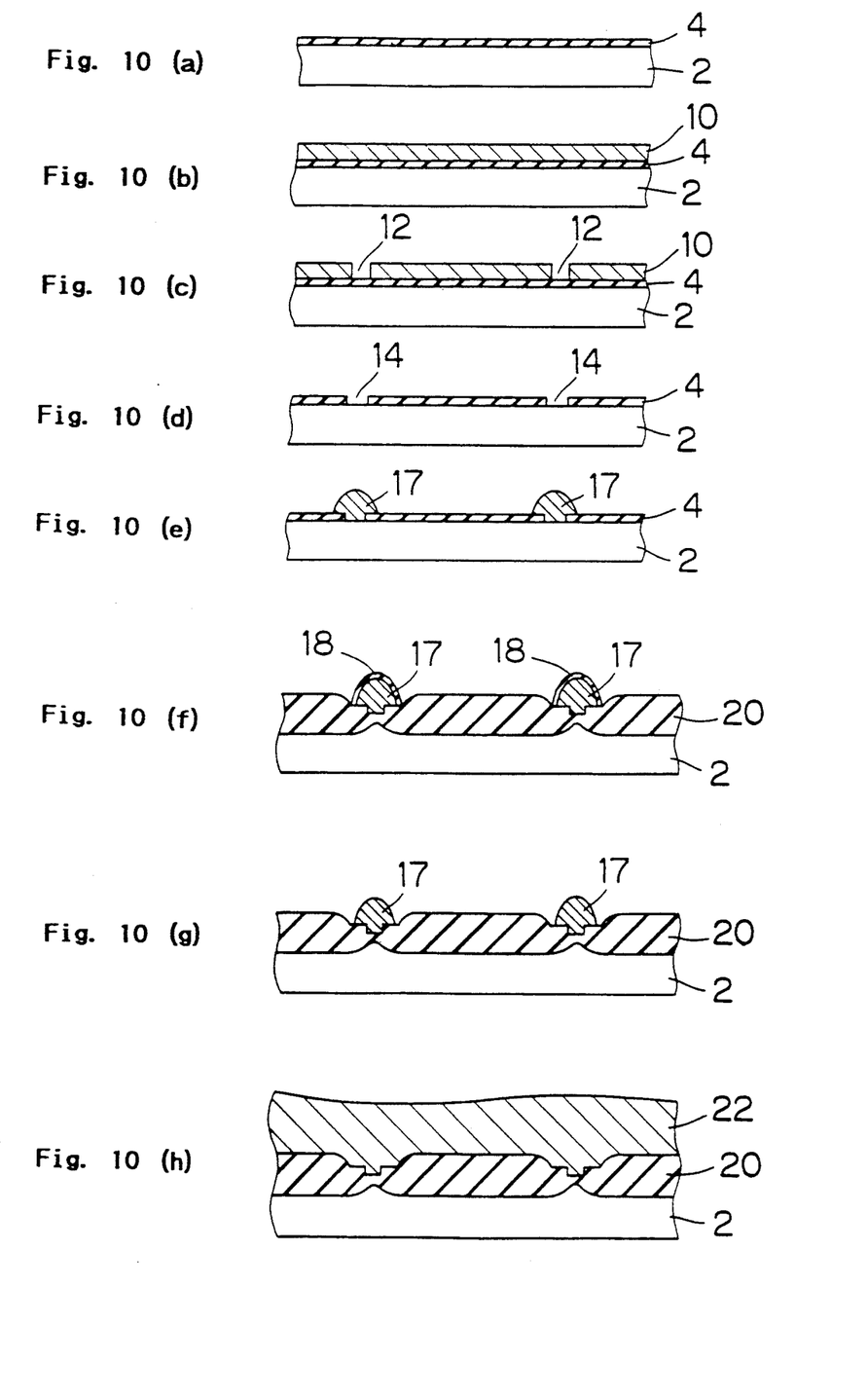
FIGS. 10(a)-10(h) are simplified cross-sectional views showing the sequential steps of another method of manufacturing a semiconductor device previously proposed by the applicant of the present application.

Therefore, the applicant of the present application has proposed manufacturing methods shown in FIGS. 9 and 10 as a method of manufacturing a semiconductor device having a silicon growth layer which is completely insulated from a substrate by an insulation layer and is uniform in surface direction.

In the manufacturing method shown in FIG. 9, a silicon oxide layer 4 is first formed on a silicon substrate 2 (see FIG. 9 (a)). Openings 14 are then formed in this silicon oxide layer 4 (see FIG. 9 (d)). Silicon is grown until it is slightly projected from each of the openings 14, to form a seed crystalline silicon layer 16 (see FIG. 9 (e)). Thereafter, a nitride film 18 is formed on the surface of the seed crystalline silicon layer 16, followed by oxidation (see FIG. 9 (g)). Consequently, field oxide layers 20 are coupled to each other in the bottom part of the opening 14, so that the seed crystalline silicon layer 16 is insulated from the silicon substrate 2 (see FIG. 9 (h)). Thereafter, epitaxial growth is made from the seed crystalline silicon layer 16, to obtain a silicon growth layer 21 (see FIG. 9 (i)). Devices are formed on the growth layer 21.

On the other hand, in the manufacturing method shown in FIG. 10, a silicon oxide layer 4 is first formed on a silicon substrate 2 (see FIG. 10 (a)). Openings 14 are then formed in this silicon oxide layer 4 (see FIG. 10 (d)). Silicon carbide is grown until it is projected from each of the openings 14, to form a seed crystalline silicon carbide layer 17 (see FIG. 10 (e)), followed by oxidation. Consequently, field oxide layers 20 are coupled to each other in the lower part of the opening 14, so that the seed crystalline silicon carbide layer 17 is insulated from the silicon substrate 2 (see FIG. 10 (f)). Thereafter, epitaxial growth is made from the seed crystalline silicon carbide layer 17, to obtain a silicon carbide growth layer 22 (see FIG. 10 (h)). Devices are formed on the growth layer 22.

According to the above-described manufacturing methods, the growth layers 21 and 22 having no p-n junction between the silicon substrate 2 and the same can be obtained, as respectively shown in FIGS. 9 (i) and 10 (h). Moreover, both the seed crystalline layers 16 and 17 each formed on the respective parts of the silicon substrate 2 are single crystals each grown using the surface of the silicon substrate 2 as a seed crystal. Therefore, the growth layers 21 and 22 grown from the respective seed crystalline layers 16 and 17 each formed on the substrate 2 can be uniform in surface direction.

In each of the above described manufacturing methods, however, it is necessary to grow the silicon oxide layer 4 in the lateral direction to close the openings 14. Accordingly, the width or the diameter of the opening 14 must be, for example, not more than 2 $\mu$m, that is, the size of the opening 14 cannot be made too large.

Stacking faults are liable to occur in the interface of the opening 14 and the seed crystalline layer 16 or 17. Accordingly, the percentage of a crystal in the central part, where there are few stacking faults, of the seed crystalline layer 16 or 17 grown from the small opening 14 is low. That is, it is difficult to obtain the seed crystalline layers 16 and 17 having high crystallinity. As a result, the crystallinity of the growth layers 21 and 22 becomes low.

Furthermore, the width or the diameter of the opening 14 is limited to not more than 2 $\mu$m. Accordingly, the seed crystalline layer 16 or 17 cannot be formed to have a very large area. Therefore, a long time is required to epitaxially grow the seed crystalline layers 16 and 17 to obtain the growth layers 21 and 22 having a required area.

SUMMARY OF THE INVENTION

Therefore, an object of the present invention is to provide a method of manufacturing a semiconductor device capable of forming a semiconductor growth layer insulated from a semiconductor substrate and having high crystallinity.

Another object of the present invention is to provide a method of manufacturing a semiconductor device capable of shortening the time required to obtain a semiconductor growth layer having a required area.

In the present invention, an insulation layer is formed on a semiconductor substrate, and an opening for seed crystal growth is formed in the insulation layer. A seed crystalline layer is formed, starting from the opening, and the seed crystalline layer is grown until it is projected from the above-described opening, and the seed crystalline layer is further grown so as to extend in the lateral direction by lateral growth.

The seed crystalline layer is selectively oxidized while leaving the seed crystalline layer required for crystal growth around the opening. An oxide formed at this time closes the above described opening. Consequently, the connection between the seed crystalline layer and the semiconductor substrate is interrupted.

In such a manner, the seed crystalline layer insulated from the semiconductor substrate is epitaxially grown, thereby to make it possible to form on the insulation layer a semiconductor growth layer insulated from the semiconductor substrate.

No p-n junction is formed between the semiconductor growth layer and the semiconductor substrate, thereby not to cause a reduction in the operating speed of devices due to parasitic capacitance. Consequently, it is possible to realize a semiconductor device which can be operated at high speed. In addition, the semiconductor growth layer is insulated from the semiconductor substrate, thereby to make it possible to prevent occurrence of the latch-up phenomenon.

In the above-described manufacturing method, when a plurality of seed crystalline layers are formed in respective parts of the semiconductor substrate, the seed crystalline layers are the same in surface direction. The reason for this is that the seed crystalline layers are grown, starting from the surface of the semiconductor substrate exposed from openings formed in the insulation layer. Consequently, it is possible to easily control device characteristics in forming devices on the semiconductor growth layer.

On the other hand, the opening formed in the insulation layer is closed by selective oxidation of the seed crystalline layer above the opening. Consequently, the seed crystalline layer is insulated from the semiconductor substrate. In this method, there is no restriction on the size of the opening, unlike the above described proposed techniques for growing the insulation layer in the lateral direction to close the openings.

Therefore, the percentage of a portion, which is affected by stacking faults occurring in the interface of a seed crystalline layer and the sidewall of an opening, of the seed crystalline layer can be decreased by increasing the size of the opening. In addition, the seed crystalline layer can be formed by growth in the lateral direction by increasing the size of the opening. A seed crystalline layer having high crystallinity is thus formed. Therefore, a semiconductor growth layer grown from the seed crystalline layer has high crystallinity.

Additionally, a large seed crystalline layer can be formed by forming a large opening in an insulation layer, thereby to make it possible to grow a semiconductor layer in a short time thereafter.

The foregoing and other objects, features, aspects and advantages of the present invention will become more apparent from the following detailed description of the present invention when taken in conjunction with the accompanying drawings.

DESCRIPTION OF THE PREFERRED EMBODIMENTS

FIGS. 1(a)-1(i) are simplified cross-sectional views showing the sequential steps of a method of manufacturing a semiconductor device according to an embodiment of the present invention.

Figure 1:
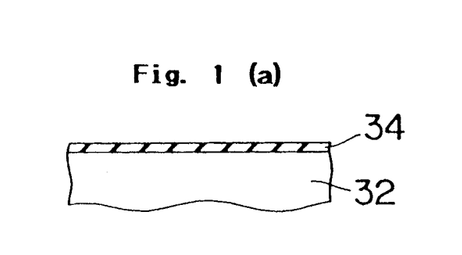
FIGS. 1(a)-1(i) are simplified cross sectional view showing the sequential steps of a method of manufacturing a semiconductor device according to one embodiment of the present invention.

First, a silicon substrate 32 is placed in a flow of oxygen so that the temperature thereof is kept high, to thermally oxidize the surface thereof. Consequently, a silicon oxide layer (SiO$_2$) 34, which is an insulation layer, is formed on the surface of the silicon substrate 32, as shown in FIG. 1 (a). It is preferable that the silicon oxide layer 34 is so formed as to have a small thickness of, for example, approximately 200 nm. The reason for this is that at the time of the growth of a seed crystalline silicon layer 46 as described later, the area of the interface between the seed crystalline silicon layer 46 and the oxide layer 34 is decreased, thereby to make it possible to form a seed crystal superior in quality.

As shown in FIG. 1 (b), a photoresist 40 is then applied on the silicon oxide layer 34. Ultraviolet exposure is made with a mask being placed on the photoresist 40, followed by development, to form an opening 42 in a desired position of the photoresist 40 as shown in FIG. 1 (c). In this state, the silicon oxide layer 34 is isotropically etched utilizing the photoresist 40 as a mask. Thereafter, the photoresist layer 40 is removed using a mixture of sulfuric acid and hydrogen peroxide. Consequently, an opening 44 for seed crystal growth, whose wall is sloped inward, is formed, as shown in FIG. 1 (d).

In a state shown in FIG. 1 (d), single-crystalline silicon is epitaxially grown, starting from the surface of the silicon substrate 32 exposed from the opening 44. Consequently, a seed crystalline silicon layer 46 is formed over the opening 44 and covering a portion of the exposed insulation layer 34 in a vicinity of the opening 44, as shown in FIG. 1 (e). In the epitaxial growth for forming the seed crystalline silicon layer 46, control is so carried out that the growth in the lateral direction is accelerated, and the growth in the longitudinal direction is suppressed to not more than 1 μm.

Figure 2:
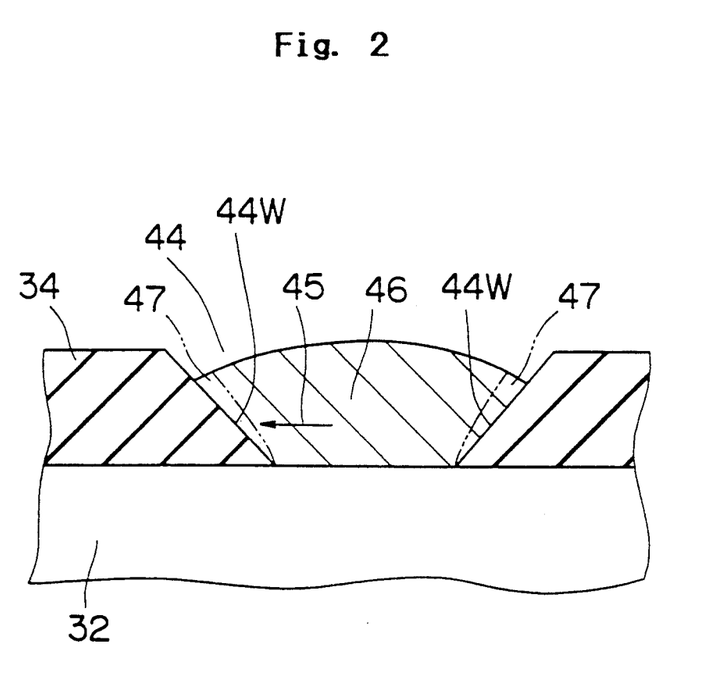
FIG. 2 is a cross-sectional view showing a state where a seed crystalline layer is grown in the step of growing a seed crystalline layer in a partially enlarged manner.

As shown in an enlarged manner in FIG. 2, a wall 44W of the opening 44 is sloped toward the inside of the opening 44. Accordingly, even when the conditions of the epitaxial growth are so set that the growth rate in the lateral direction is higher than the growth rate in the longitudinal direction, it is possible to grow the seed crystalline silicon layer 46 in a sufficiently short time. That is, if the wall 44W of the opening 44 is perpendicular to the silicon substrate 32, it takes long to form the seed crystalline silicon layer 46 under a condition that the growth rate in the lateral direction is higher than the growth rate in the longitudinal direction.

Furthermore, even if stacking faults occur in the interface of the seed crystalline silicon layer 46 and the silicon oxide layer 34, the effect of the stacking faults is not exerted on the central part of the seed crystalline silicon layer 46 because the wall 44W of the opening 44 is sloped. Moreover, the seed crystalline silicon layer 46 is grown in the lateral direction, as indicated by an arrow 45 in FIG. 2, at a high rate, so that it is grown in succession to the nature of the central part where there are few faults of the seed crystalline silicon layer 46. Consequently, the effect of the stacking faults occurring in the interface of the seed crystalline silicon layer 46 and the silicon oxide layer 34 is only exerted on, for example, a narrow region 47 shown in FIG. 2. In such a manner, a high percentage of the seed crystalline silicon layer 46 will have high crystallinity.

Furthermore, it is preferable that the epitaxial growth for forming the seed crystalline silicon layer 46 is made at as low temperatures as possible ranging, for example, from 900° C. to 1100° C. The reason for this is that the stacking faults can be restrained by making the epitaxial growth at low temperatures.

Additionally, if the silicon oxide layer 34 is formed on a (100) silicon substrate in a [100] direction in accordance with a rectangular pattern, the stacking faults can be restrained.

Furthermore, if thin polysilicon or a thin silicon nitride film is attached to the wall 44W of the opening 44 in the silicon oxide layer 34 before making the growth to improve lattice matching, the stacking faults can be further restrained.

If a plurality of seed crystalline silicon layers 46 are formed on the silicon substrate 32 in the above-described manner, the plurality of seed crystalline silicon layers 46 are the same in surface direction. The reason for this is that any one of the seed crystalline silicon layers 46 is grown, starting from the surface of the same silicon substrate 2.

The surface of the seed crystalline silicon layer 46 is then selectively nitrided. Consequently, a silicon nitride layer (Si$_3$N$_4$) 48 serving as a barrier layer is formed in a region other than a portion 46a corresponding to the above-described opening 44, as shown in FIG. 1 (f).

The seed crystalline silicon layer 46 is subjected to selective oxidation processing. Since the oxidation rate of silicon nitride is lower than that of silicon, the seed crystalline silicon layer 46 is gradually oxidized from the portion 46a where the silicon nitride layer 48 is not formed.

This selective oxidation processing is performed until SiO$_2$ 49 grown in the seed crystalline silicon layer 46 closes the upper part of the opening 44. The silicon oxide layer 34 is also simultaneously oxidized and grown in the lateral direction so that bird's beaks are formed as the SiO$_2$ 49 is grown. Consequently, the bottom part of the SiO$_2$ 49 grown in the seed crystalline silicon layer 46 and the silicon oxide layer 34 are connected to each other, to be a field oxide layer 50, as shown in FIG. 1 (g).

The seed crystalline silicon layer 46 remaining without being oxidized is thus insulated from the silicon substrate 32.

Etching is then performed using high-temperature phosphoric acid and the like to remove the silicon nitride layer 48 (see FIG. 1 (h)). Thereafter, as shown in FIG. 1(a), epitaxial growth is promoted in the lateral direction so that the growth layer 52 lays on and covers the field oxide layer 50, utilizing the seed crystalline silicon layer 46 as a seed crystal. In the epitaxial growth in this case, control is so carried out that the growth in the lateral direction is larger. This control is achieved by epitaxially growing the seed crystalline silicon layer 46 in a state where an SiO$_2$ film, for example, is formed on the upper surface of the seed crystalline silicon layer 46. If the growth is continued, growth layers 52, grown from the plurality of seed crystalline silicon layers 46 formed on the silicon substrate 32 are connected to each other. A structure obtained in the above-described manner is shown in FIG. 1 (i).

The epitaxial growth layer 52 is insulated from the silicon substrate 32 by the field oxide layer 50. Consequently, no parasitic capacitance due to a p-n junction arises between the epitaxial growth layer 52 and the silicon substrate 32. If devices such as transistors, FET's or the like are formed on the epitaxial growth layer 52, therefore, the devices can be operated at high speed. In addition, there is no parasitic capacitance due to a p-n junction, thereby to obtain superior high-frequency characteristics. Further, the epitaxial growth layer 52 can be completely insulated from the silicon substrate 32, thereby to make it possible to prevent occurrence of the latch-up phenomenon.

Furthermore, each of the plurality of seed crystalline silicon layers 46 formed on the silicon substrate 32 is grown utilizing the surface of the silicon substrate 32 as a seed crystal. Accordingly, the seed crystalline silicon layers 46 are equal in surface direction. Therefore, the epitaxial growth layer 52 formed on the substrate 32 is uniform in surface direction. Consequently, respective parts of the epitaxial growth layer 52 are equal in oxidation rate or the like, so that device characteristics can be easily controlled in forming the devices on the epitaxial growth layer 52.

Figure 3:
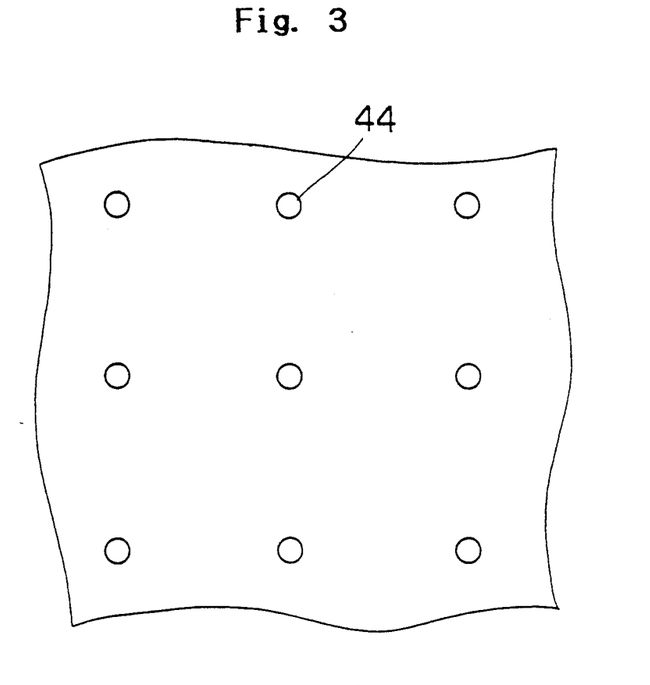
FIG. 3 is a plan view showing one example of openings formed in a silicon oxide insulation layer.

Meanwhile, the shape of the opening 44 may be suitably selected in accordance with the epitaxial growth layer 52 required. For example, circular holes may be formed in a discrete manner, as shown in FIG. 3, to perform as openings 44. In this case, the epitaxial growth layer 52 is formed on the whole surface excluding the openings 44. Consequently, an epitaxial growth layer 52 having a large area which is insulated from the silicon substrate 32 can be obtained, thereby to make it possible to form a very large-scale integrated circuit (VLSI) or the like.

Figure 4:
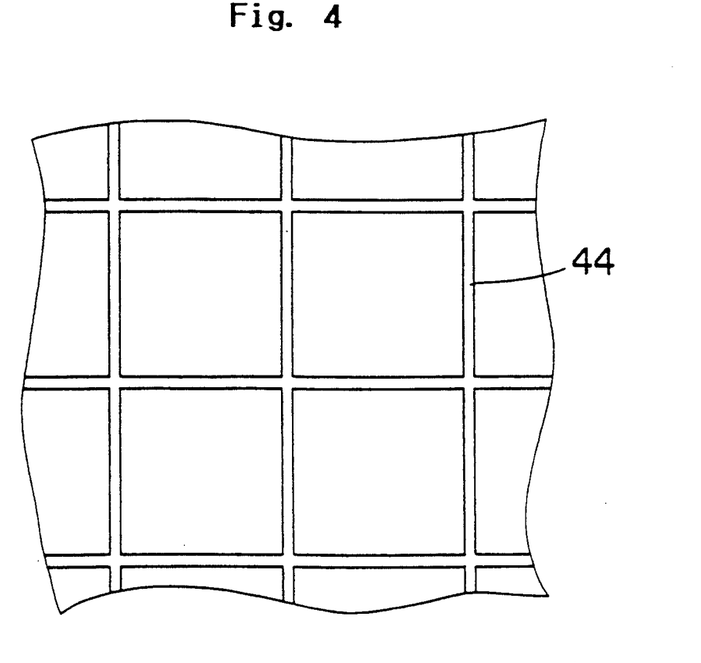
FIG. 4 is a plan view showing another example of openings formed in a silicon oxide insulation layer.

Furthermore, lattice-shaped grooves may be formed, as shown in FIG. 4, to perform as openings 44. In this case, a plurality of epitaxial growth layers 52, isolated in an island shape by the openings 44, are obtained. Consequently, one of regions surrounded by the openings 44 is taken as a unit region required for device formation, thereby to make it possible to reliably isolate the regions for device formation in the lateral direction. In this case, the field oxide layer 50 contributes to the isolation in the lateral direction of the regions for device formation.

Meanwhile, the surface direction of the silicon substrate 32 is (100). Accordingly, in either one of the cases shown in FIGS. 3 and 4, it is possible to restrain the occurrence of faults if the direction of patterning of the silicon oxide layer 34 is taken as [100]. Accordingly, it is more preferable to consider this aspect.

Figure 5:
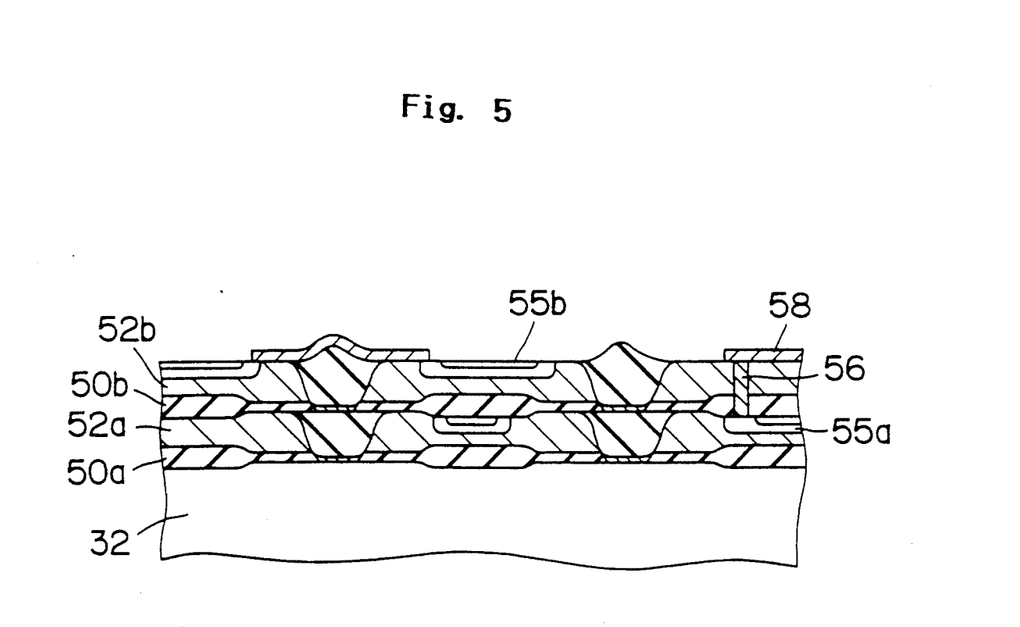
FIG. 5 is a cross-sectional view showing an example in which an integrated circuit having a three-dimensional structure is formed.

Furthermore, if the devices are formed on the epitaxial growth layer 52 shown in FIG. 1 (i) and then, each of the steps shown in FIGS. 1 (a) to 1 (i) is further repeatedly carried out, it is possible to form an integrated circuit having a three-dimensional structure. For example, if each of the steps shown in FIGS. 1 (a) to 1 (i) is repeated twice, it is possible to form an integrated circuit having a three-dimensional structure, as shown in FIG. 5.

More specifically, a first epitaxial growth layer 52a is formed on a silicon substrate 32 with a first field oxide layer 50a being interposed therebetween. A second epitaxial growth layer 52b is formed on the first epitaxial growth layer 52a with a second field oxide layer 50b being interposed therebetween.

In this structure, circuit devices 55a and 55b can be respectively formed on the first epitaxial growth layer 52a and the second epitaxial growth layer 52b, thereby to make it possible to obtain an integrated circuit which is high in integration density.

Meanwhile, when an electrode is taken out to the exterior from the circuit device 55a formed on the first epitaxial growth layer 52a, a hole, passing through the second epitaxial growth layer 52b and the second field oxide layer 50b to the first epitaxial growth layer 52a, is formed. Polysilicon (Polycrystalline silicon) 56 or the like is embedded in this hole, so that the circuit device 55a and an electrode 58 formed on the second epitaxial growth layer 52b are connected to each other.

It goes without saying that a structure having three or more epitaxial growth layers may be formed by repeating each of the steps shown in FIGS. 1 (a) to 1 (i) three or more times.

As described in the foregoing, in the present embodiment, a portion, which is located above the opening 44, of the seed crystalline silicon layer 46 is selectively oxidized, so that the opening 44 is closed by the $SiO_2$ 49. In such a manner, a non-oxidized portion of the seed crystalline silicon layer 46 is insulated from the silicon substrate 32. The non-oxidized portion of the seed crystalline silicon layer 46 becomes a seed crystal for forming the epitaxial growth layer 52.

In the techniques previously proposed by the applicant of the present application shown in FIGS. 9 and 10, it is necessary to grow the silicon oxide layer formed on the surface of the silicon substrate in the lateral direction so as to close the opening in the silicon oxide layer. On the other hand, in the manufacturing method according to the present embodiment, the opening 44 in the silicon oxide layer 34 is closed by not growing the silicon oxide layer 34 in the lateral direction but selectively oxidizing the seed crystalline silicon layer 46.

Therefore, there is no restriction on the size of the opening 44. Therefore, the percentage of a portion, which is affected by the stacking faults, of the seed crystalline silicon layer 46 can be decreased by increasing the size of the opening 44. In other words, the seed crystalline silicon layer 46 can have high crystallinity.

Moreover, the size of the opening 44 can be increased, thereby to make it possible to increase the size of islands of the seed crystalline silicon layer 46. Consequently, it is possible to shorten the time required to form the epitaxial growth layer 52.

Furthermore, the wall of the opening 44 is sloped, thereby to make it possible to satisfactorily form the seed crystalline silicon layer 46 by the epitaxial growth in the lateral direction. Moreover, the effect of the stacking faults is restrained, thereby to obtain the seed crystalline silicon layer 46 having high crystallinity.

Meanwhile, when the size of the opening 44 is sufficiently increased, it is possible to form the seed crystalline silicon layer 46 by epitaxial growth in the lateral direction in a sufficiently short time, even if the wall of the opening 44 is not sloped.

The above described embodiment can be modified, for example, as follows. A nitride film may be deposited to form the silicon nitride film 48 by the CVD (Chemical Vapor Deposition) process and the like in place of nitriding the surface of the seed crystalline silicon layer 46 in the step shown in FIG. 1 (f) to form the silicon nitride film 48 in the above-described embodiment. In addition, a material having an oxidation rate sufficiently lower than that of silicon, for example, silicon carbide may be used in place of the silicon nitride film 48.

FIGS. 6(a)-6(l) are cross-sectional view showing the sequential steps of a method of manufacturing a semiconductor device according to another embodiment of the present invention. In he manufacturing method according to the present embodiment, the steps from the step of forming a silicon oxide layer 34 to the step of forming a seed crystalline silicon layer 46 are respectively the same as those shown in the above-described first embodiment. That is, the steps shown in FIGS. 6 (a) to 6 (e) are respectively the same as the steps shown in FIGS. 1 (a) to 1 (e).

Figure 6:
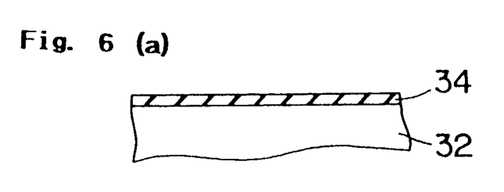
FIGS. 6(a)-6(l) are simplified cross-sectional views showing the sequential steps of a method of manufacturing a semiconductor device according to another embodiment of the present invention.

In the present embodiment, in a state shown in FIG. 6 (e) where the seed crystalline silicon layer 46 is formed, a photoresist 61 is applied on the seed crystalline silicon layer 46 and the silicon oxide layer 34, as shown in FIG. 6 (f).

Ultraviolet exposure is made with a mask being placed in a portion, which corresponds to the above-described opening 44, of the photoresist 61 applied on the seed crystalline silicon layer 46, followed by development, to form an opening 61a as shown in FIG. 6 (g). In this state, the seed crystalline silicon layer 46 is etched utilizing the photoresist 61 as a mask. As shown in FIG. 6 (g), therefore, the seed crystalline silicon layer 46 inside the opening 44 and above the opening 44 is removed, leaving the seed crystalline silicon layer 46 required for crystal growth around the opening 44.

The etching of the seed crystalline silicon layer 46 may be stopped with a part of the seed crystalline silicon layer 46 remaining inside the opening 44. Alternatively, it may be made until the silicon substrate 32 is exposed from the opening 44.

Meanwhile, the etch rates of the seed crystalline silicon layer 46 and the silicon oxide layer 34 differ from each other, so that the silicon oxide layer 34 remains.

As shown in FIG. 6 (h), the photoresist layer 61 is then removed using a mixture of sulfuric acid and hydrogen peroxide.

When oxidation processing is then performed, a state shown in FIG. 6 (i) occurs. That is, the surfaces of the silicon oxide layer 34, and the seed crystalline silicon layer 46 required for crystal growth which is left in the step shown in FIG. 6 (g), are oxidized, to form a field oxide layer 62. This field oxide layer 62 closes the opening 44, to insulate the silicon substrate 32 and the seed crystalline silicon layer 46 from each other.

If the silicon substrate 32 is exposed from the opening 44, the surface of the silicon substrate 32 is oxidized to form a silicon oxide film. On the other hand, if a part of the seed crystalline silicon layer 46 remains inside the opening 44, the remaining seed crystalline silicon layer 46 is oxidized to form a silicon oxide film. In either case, therefore, the silicon oxide film is formed within the opening 44. This silicon oxide film is connected to the silicon oxide layer 34, to be a field oxide layer 62. That is, the opening 44 is closed by the silicon oxide film grown from the silicon substrate 32 or the seed crystalline silicon layer 46 within the opening 44.

SOG (Spin On Glass) 63 is then applied on the surface of the field oxide layer 62, as shown in FIG. 6 (j).

In this state, the SOG 63 and the field oxide layer 62 are further removed by the etch back to flatten the surface so that the seed crystalline silicon layer 46 is exposed, as shown in FIG. 6 (k).

Thereafter, epitaxial growth is promoted in the lateral direction to cover the field oxide layer 62 utilizing the seed crystalline silicon layer 46 as a seed crystal. In the epitaxial growth in this case, control is so carried out that the growth rate in the lateral direction is higher than the growth rate in the longitudinal direction. This control is, for example, achieved by epitaxially growing the seed crystalline silicon layer 46 with a SiO$_2$ film, for example, being formed on the upper surface of the seed crystalline silicon layer 46. Consequently, layers grown from a plurality of seed crystalline silicon layers 46 which are formed on the silicon substrate 32 are connected to each other, to form an epitaxial growth layer 65 covering the surface, as shown in FIG. 6 (l).

In FIG. 6 (l), the epitaxial growth layer 65 is insulated from the silicon substrate 32 by the field oxide layer 62. Consequently, no p-n junction is formed between the epitaxial growth layer 65 and the silicon substrate 32, as in the above described first embodiment.

Furthermore, each of the plurality of seed crystalline silicon layer 46 formed on respective parts of the silicon substrate 32 is grown, starting from the surface of the silicon substrate 32 exposed from the opening 44. Accordingly, the seed crystalline silicon layers 46 are equal in surface direction. Consequently, the epitaxial growth layer 65 is uniform in surface direction.

As described in the foregoing, in the present embodiment, portions, which are located inside the opening 44 and above the opening 44, of the seed crystalline silicon layers 46 grown starting from the opening 44 are selectively etched away. The silicon substrate 32 exposed from the opening 44 or the seed crystalline silicon layer 46 remaining inside the opening 44 is oxidized by oxidation processing, to be the field oxide layer 62. That is, SiO$_2$ can be grown within the opening 44 by itself.

Consequently, the opening 44 can be closed without depending on the growth of the silicon oxide layer 34 in the lateral direction, to insulate the seed crystalline silicon layer 46 and the silicon substrate 32 from each other. Consequently, there is no restriction on the size of the opening 44.

The above-described shape shown in FIG. 2 or FIG. 3 is applicable to the shape of the opening 44. In the manufacturing method according to the present embodiment, the epitaxial growth layer 65 covering the entire surface of the substrate 32 can be formed even if the opening 44 is in either shape, as apparent from a structure shown in FIG. 6 (l).

Furthermore, devices are formed on the epitaxial growth layer 65 shown in FIG. 6 (l) and then, each of the steps shown in FIGS. 6 (a) to 6 (l) is repeatedly carried out, thereby to make it possible to form an integrated circuit having a threedimensional structure. For example, if each of the steps shown in FIGS. 6 (a) to 6 (l) is repeated twice, it is possible to form an integrated circuit having the three-dimensional structure shown in FIG. 7.

Figure 7:
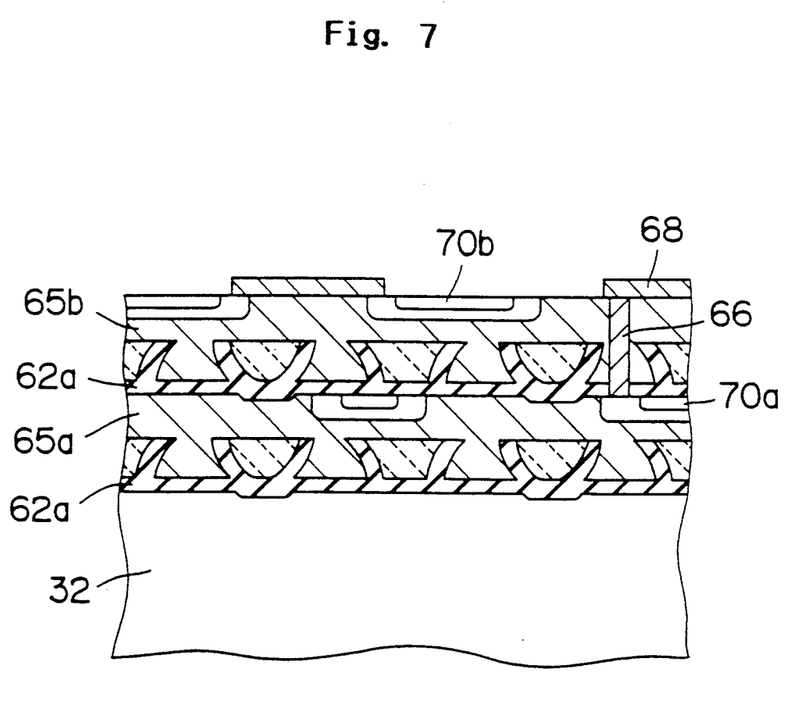
FIG. 7 is a cross sectional view showing an example in which an integrated circuit having a three-dimensional structure is formed.

More specifically, a first epitaxial growth layer 65a is formed on a silicon substrate 32 with a first field oxide layer 62a being interposed therebetween. A second epitaxial growth layer 65b is formed on the first epitaxial growth layer 65a with a second field oxide layer 62b being interposed therebetween.

In this structure, circuit devices 70a and 70b can be respectively formed on the first epitaxial growth layer 65a and the second epitaxial growth layer 65b. Therefore, it is possible to obtain an integrated circuit which is high in integration density.

Meanwhile, when an electrode is taken out to the exterior from the circuit device 70a formed on the first epitaxial growth layer 65a, a hole, passing through the second epitaxial growth layer 65b and the second field oxide layer 62b to the first epitaxial growth layer 65a, for example, is formed. Polysilicon 66 or the like is embedded in the hole, so that the circuit device 70a and an electrode 68 formed on the second epitaxial growth layer 65b are connected to each other.

Furthermore, it goes without saying that a structure having three or more epitaxial growth layers may be formed by repeatedly carrying out each of the steps shown in FIGS. 6 (a) to 6 (l) three or more times.

Additionally, when it is desired to only grow the seed crystalline silicon layer 46 in the lateral direction, for example, the surface of the seed crystalline silicon layer 46 may be covered with an oxide film in the stage in which the seed crystalline silicon layer 46 is slightly projected from the opening 44.

FIG. 8(a)-8(l) are cross-sectional views showing the sequential steps of a method of manufacturing a semiconductor device according to still another embodiment of the present invention. The manufacturing method in the present embodiment is approximately the same as that in the above-described second embodiment shown in FIGS 6(a)-6(l), and the steps shown in FIGS. 8 (a) to 8 (l) respectively correspond to the steps shown in FIGS. 6 (a) to 6 (l).

The difference between the present embodiment and the above-described second embodiment is that an epitaxial growth layer 85 composed of silicon carbide is formed in place of the epitaxial growth layer 65 composed of silicon.

Figure 8:
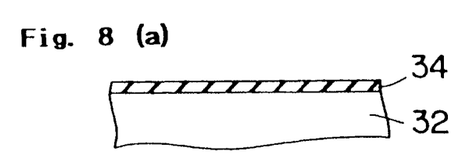
FIGS. 8(a)-8(l) are simplified cross-sectional views view showing the sequential steps of a method of manufacturing a semiconductor device according to still another embodiment of the present invention.

More specifically, in the step of growing a seed crystalline layer as shown in FIG. 8 (e), a seed crystalline silicon carbide layer 86 is formed. In order to reduce lattice mismatching of a silicon substrate 32 and the seed crystalline layer 86 composed of 3C-SiC, however, an opening 44 is formed in the step shown in FIG. 8 (d) and then, the surface of the silicon substrate 32 exposed is carbonized. This carbonized surface serves as a buffer layer.

The other steps are the same as those in the above-described case where silicon is used as a seed crystal. In the step shown in FIG. 8 (g) where a portion, which is located above the opening 44, of the seed crystalline silicon carbide layer 86 is etched, it is necessary to expose the surface of the silicon substrate 32 by removing the seed crystalline silicon carbide layer 86 inside the opening 44. The reason for this is that the oxidation rate of silicon carbide is lower than the oxidation rate of silicon. That is, if the seed crystalline silicon carbide layer 86 remains inside the opening 44, it is impossible to satisfactorily grow silicon oxide within the opening 44 in the step of oxidation processing shown in FIG. 8 (i), so that the seed crystalline layer 86 and the silicon substrate 32 are liable to be insufficiently insulated from each other.

Although the present invention has been described and illustrated in detail, it is clearly understood that the same is by way of illustration and example only and is not to be taken by way of limitation, the spirit and scope of the present invention being limited only by the terms of the appended claims.

What is claimed is:

1. A method of manufacturing a semiconductor device, comprising the steps of:
    (a) forming an insulation layer on a semiconductor substrate;
    (b) forming an opening for seed crystal growth in said insulation layer;
    (c) forming a seed crystalline layer in the opening, starting from the surface of the semiconductor substrate exposed by the opening, growing the seed crystalline layer until it is projected from the opening, and further growing the seed crystalline layer so as to extend in the lateral direction over a portion of the insulation layer in a vicinity of the opening without covering the insulation layer outside of the vicinity of the opening, by lateral growth;
    (d) selectively oxidizing a portion of the seed crystalline layer, the selectively oxidized portion including at least a part of the seed crystalline layer above the opening so that a remaining portion of the seed crystalline layer required for crystal growth is left around the opening, and closing the opening by an oxide formed, to interrupt the connection between the seed crystalline layer which is left around the opening and the semiconductor substrate; and
    (e) epitaxially growing the seed crystalline layer which is left around the opening after said step (d) to form a semiconductor growth layer covering the insulation layer outside the vicinity of the opening.

2. The method according to claim 1, wherein said step (d) of interrupting the connection between the seed crystalline layer and the semiconductor substrate comprises the steps of
    forming a barrier layer having an oxidation rate lower than the oxidation rate of the seed crystalline layer on the surface of the seed crystalline layer, excluding a portion of the surface of the seed crystalline layer corresponding to the opening and
    oxidizing the seed crystalline layer from the excluded portion of the surfaces of the seed crystalline layer, where the barrier layer is not formed, and closing the opening by enlarging an oxidized region while leaving the remaining portion of the seed crystalline layer required for crystal growth, to interrupt the connection between the seed crystalline layer and the semiconductor substrate.

3. The method according to claim 2, further comprising
    the step of removing the barrier layer to expose said seed crystalline layer before said step (e) of forming a semiconductor growth layer.

4. The method according to claim 2, wherein
    the seed crystalline layer is composed of single-crystalline silicon, and the barrier layer is composed of a silicon nitride film.

5. The method according to claim 1, wherein
    the semiconductor substrate is a silicon substrate.

6. The method according to claim 1, wherein
    the insulation layer is composed of a silicon oxide film.

7. The method according to claim 1, wherein
    the seed crystalline layer is composed of single-crystalline silicon, and the semiconductor growth layer is an epitaxial growth layer composed of silicon.

8. The method according to claim 1, wherein
    the opening formed in the insulation layer is so formed that its wall is sloped inward.

9. The method according to claim 8, wherein
    the opening is formed by isotropic etching.

10. The method according to claim 1, wherein in said step (b) of forming an opening, holes arranged in a discrete manner are formed in the insulation layer.

11. The method according to claim 1, wherein
in said step (b) of forming an opening, a lattice-shaped groove is formed in the insulation layer.

12. The method according to claim 11, wherein
the lattice-shaped groove is so patterned that semiconductor growth layers isolated in an island shape by the groove respectively form unit regions for device formation, and
the oxide of the seed crystalline layer closing the opening serves as a field insulation layer for isolating the unit regions for device formation.

13. The method according to claim 1, wherein
said steps (a) to (e) are carried out repeatedly.

14. A method of manufacturing a semiconductor device, comprising the steps of:
  (a) forming an insulation layer on a semiconductor substrate;
  (b) forming an opening for seed crystal growth in the insulation layer;
  (c) forming a seed crystalline layer in the opening, starting from the surface of the semiconductor substrate exposed by the opening, growing the seed crystalline layer until it is projected from the opening, and further growing the seed crystalline layer so as to extend in the lateral direction over a portion of the insulation layer in a vicinity of the opening without covering a portion of the insulation layer outside of the vicinity of the opening, by lateral growth;
  (d) selectively removing a portion of the seed crystalline layer, the removed portion including at least the part of the seed crystalline layer above the opening, so that a remaining portion of the seed crystalline layer required for crystal growth is left around the opening;
  (e) oxidizing the remaining portion of the seed crystalline layer which is left on the surface of the semiconductor substrate inside the opening and/or a surface of the semiconductor substrate inside the opening, to grow an oxide film within the opening, to interrupt the connection between the seed crystalline layer which is left around the opening and the semiconductor substrate; and
  (f) epitaxially growing the seed crystalline layer which is left around the opening, to form a semiconductor growth layer covering the portion of the insulation layer outside of the vicinity of the opening.

15. The method according to claim 14, wherein
the semiconductor substrate is a silicon substrate.

16. The method according to claim 14, wherein
the insulation layer is composed of a silicon oxide film.

17. The method according to claim 14, wherein
the seed crystalline layer is composed of single-crystalline silicon, and the semiconductor growth layer is an epitaxial growth layer composed of silicon.

18. The method according to claim 14, wherein
the seed crystalline layer is composed of single-crystalline silicon carbide, and the semiconductor growth layer is an epitaxial growth layer composed of silicon carbide.

19. The method according to claim 18, further comprising
the step of carbonizing the surface of the semiconductor substrate exposed from the opening before said step (c) of forming a seed crystalline layer.

20. The method according to claim 14, wherein
the opening formed in the insulation layer is so formed that its wall is sloped inward.

21. The method according to claim 20, wherein
the opening is formed by isotropic etching.

22. The method according to claim 14, wherein
in said step (b) of forming an opening, holes arranged in a discrete manner are formed in the insulation layer.

23. The method according to claim 14, wherein
in said step (b) of forming an opening, lattice-shaped groove is formed in the insulating layer.

24. The method according to claim 14, wherein
said steps (a) to (f) are carried out repeatedly.

25. The method according to claim 14, further comprising, between said steps (e) and (f), steps of
forming a layer composed of an insulation material over the entire surface of the substrate, and
etching back the layer composed of an insulation material to flatten the surface of the substrate so that an upper surface of the seed crystalline layer is exposed.

26. The method according to claim 14, wherein said step (f) includes the step of epitaxially growing the seed crystalline layer which is left around the opening after said step (d), so that the semiconductor growth layer covers the portion of the insulation layer outside of the vicinity of the opening and further covers the oxide grown in the opening during said step (e).

27. The method according to claim 14, wherein said step (f) includes the step of epitaxially growing the seed crystalline layer which is left around the opening after said step (d), such that the semiconductor growth layer grows above the seed crystalline layer and the oxide grown in the opening during said step (e), to cover an entire surface of the substrate.

28. The method according to claim 14, wherein said step (e) includes the steps of oxidizing an exposed surface of the entire remaining portion of the seed crystalline layer that is left on the surface of the semiconductor substrate; further comprising the steps of
  (i) applying a layer of insulation material to the surface of the oxidized surface obtained in said step (e), and
  (ii) etching back the oxidized surface and insulation material to obtain a flattened surface, including an exposed upper surface of the remaining portion of the seed crystalline layer;
  said step (f) including the step of epitaxially growing the seed crystalline layer from the exposed upper surface of the remaining portion of the seed crystalline layer obtained in said step (ii), such that the semiconductor growth layer grows on the flattened surface obtained in said step (ii) to cover the seed crystalline layer, the insulation material, and the oxide grown in the opening during said step (e).

29. The method according to claim 1, wherein the portion of the insulation layer not covered in step (c) remains exposed during said step (c), and the epitaxial growing during said step (e) serves to cover the exposed portion of the insulation layer with the semiconductor growth layer.

30. The method according to claim 1, wherein said step (e) includes the step of epitaxially growing the seed crystalline layer so that the semiconductor growth layer lays on the portion of the insulation layer outside of the vicinity of the opening.

31. A method of manufacturing a semiconductor device, comprising the steps of:
   (a) forming an insulation layer on a semiconductor substrate;
   (b) forming an opening for seed crystal growth in said insulation layer;
   (c) forming a seed crystalline layer composed of single crystalline silicon carbide in the opening, starting from the surface of the semiconductor substrate exposed by the opening, growing the seed crystalline layer until it is projected from the opening, and further growing the seed crystalline layer so as to extends in the lateral direction, by lateral growth;
   (d) selectively removing a portion of the seed crystalline layer, the removed portion including at least the part of the seed crystalline layer above the opening so that a remaining portion of the seed crystalline layer required for crystal growth is left around the opening;
   (e) oxidizing the remaining portion of the seed crystalline layer which is left on the surface of the semiconductor substrate inside the opening and/or a surface of the semiconductor substrate inside the opening to grow an oxide film within the opening, to interrupt the connection between the seed crystalline layer which is left around the opening and the semiconductor substrate; and
   (f) epitaxially growing the seed crystalline layer which is left around said opening, to form an epitaxial growth layer composed of silicon carbide on said insulation layer.

32. The method according to claim 30, further comprising the step of carbonizing the surface of the semiconductor substrate exposed from the opening before said step (c) of forming a seed crystalline layer.

* * * * *